(12) United States Patent
Zhang et al.

(10) Patent No.: US 12,557,228 B2
(45) Date of Patent: Feb. 17, 2026

(54) DISPLAY MODULE AND DISPLAY DEVICE WITH ATTACHED COVERPLATE

(71) Applicant: WUHAN CHINA STAR OPTOELECTRONICS SEMICONDUCTOR DISPLAY TECHNOLOGY CO., LTD., Wuhan (CN)

(72) Inventors: Qi Zhang, Wuhan (CN); Xiang Chen, Wuhan (CN); Qingbo Ye, Wuhan (CN)

( * ) Notice: Subject to any disclaimer, the term of this patent is extended or adjusted under 35 U.S.C. 154(b) by 881 days.

(21) Appl. No.: 17/794,491

(22) PCT Filed: Jul. 11, 2022

(86) PCT No.: PCT/CN2022/104808
§ 371 (c)(1),
(2) Date: Dec. 7, 2023

(87) PCT Pub. No.: WO2023/231146
PCT Pub. Date: Dec. 7, 2023

(65) Prior Publication Data
US 2024/0196553 A1    Jun. 13, 2024

(30) Foreign Application Priority Data
May 30, 2022  (CN) .......................... 202210602161.2

(51) Int. Cl.
*H05K 5/03*          (2006.01)
(52) U.S. Cl.
CPC ..................................... *H05K 5/03* (2013.01)

(58) Field of Classification Search
CPC .. H05K 5/03; H05K 5/0217; G02F 1/133317; G02F 1/133308
See application file for complete search history.

(56) References Cited

U.S. PATENT DOCUMENTS

2020/0201107 A1*  6/2020  Takaira ................ G02B 6/0088
2021/0318572 A1* 10/2021  Wang ................ G02F 1/133528

FOREIGN PATENT DOCUMENTS

| CN | 105321435 A | 2/2016 |
|---|---|---|
| CN | 206638918 U | 11/2017 |
| CN | 108227269 A | 6/2018 |
| CN | 109256414 A | 1/2019 |
| CN | 110197622 A | 9/2019 |

(Continued)

OTHER PUBLICATIONS

International Search Report in International application No. PCT/CN2022/104808, mailed on Nov. 30, 2022,.

(Continued)

*Primary Examiner* — James Wu
*Assistant Examiner* — Dakota M Talbert

(57) ABSTRACT

A display module and a display device are provided. the display module includes a display panel; a coverplate disposed on a light-emitting surface of the display panel; a middle frame disposed on a same side of the coverplate as the display panel, wherein, the middle frame covers sides of the display panel and a portion of a backlight surface of the display panel, a side wall of the middle frame is connected to a backlight surface of the coverplate, and the middle frame, the display panel, and the coverplate form a first module gap; and a filling glue filled in the first module gap.

18 Claims, 3 Drawing Sheets

(56) References Cited

FOREIGN PATENT DOCUMENTS

| CN | 209417471 U | | 9/2019 | |
|---|---|---|---|---|
| CN | 209560887 U | | 10/2019 | |
| CN | 109256414 B | * | 12/2020 | ........... H05K 5/0217 |
| CN | 212112053 U | | 12/2020 | |
| CN | 112164309 A | | 1/2021 | |
| CN | 113093427 A | | 7/2021 | |
| CN | 214335607 U | | 10/2021 | |
| CN | 215867631 U | * | 2/2022 | |
| CN | 216424274 U | | 5/2022 | |
| JP | 2018141848 A | | 9/2018 | |
| WO | 2019006783 A1 | | 1/2019 | |
| WO | 2022083303 A1 | | 4/2022 | |

OTHER PUBLICATIONS

Written Opinion of the International Search Authority in International application No. PCT/CN2022/104808, mailed on Nov. 30, 2022.
Chinese Office Action Issued in corresponding Chinese Patent Application No. 202210602161.2 dated Jan. 13, 2023, pp. 1-8.

* cited by examiner

DISPLAY MODULE AND DISPLAY DEVICE WITH ATTACHED COVERPLATE

FIELD OF INVENTION

The present disclosure relates to the field of display technologies, and more particularly, to a display module and a display device.

BACKGROUND OF INVENTION

With increasing popularity of full screens, users not only have higher and higher requirements for functions and performances of the full screens, but also have higher requirements for appearances of the full screens. Full screens with narrower bezels can provide a larger effective display area, thereby providing a better visual experience.

However, due to an existence of edge wirings in display panels, it is difficult to reduce bezels of the display panels. Therefore, reducing bezels of display modules and assembly frames between the display modules and housings have become a research direction of reducing bezels of display devices. In order to ensure a good assembly effect between the display modules and the housings, the display modules need to reserve an assembly boundary with a width greater than 1 mm to connect with the housings. This causes the bezels of the display modules and the bezels of the display devices to have a large area, thereby being unable to realize a high display ratio and affecting visual experiences.

Technical problem: the present disclosure provides a display module, which can reduce the bezels of the display modules and the assembly frames between the display modules and the housings, thereby realizing the high display ratio and improving the visual experiences.

SUMMARY OF INVENTION

The present disclosure provides a display module. The display module includes:
a display panel;
a coverplate disposed on a light-emitting surface of the display panel;
a middle frame disposed on a same side of the coverplate as the display panel, wherein, the middle frame covers sides of the display panel and a portion of a backlight surface of the display panel, a side wall of the middle frame is connected to a backlight surface of the coverplate, and the middle frame, the display panel, and the coverplate form a first module gap; and
a filling glue filled in the first module gap.

Optionally, in some embodiments of the present disclosure, a sum of a width of a connection part between the coverplate and the middle frame and a width of a connection part between the coverplate and the filling glue is greater than 1 mm, and the width of the connection part between the coverplate and the middle frame is less than 1 mm, wherein, a direction of the width of the connection part between the coverplate and the middle frame and the width of the connection part between the coverplate and the filling glue is perpendicular to the side wall of the middle frame.

Optionally, in some embodiments of the present disclosure, the middle frame includes a groove having a two-sided opening, the groove is defined on one side of the middle frame facing the display panel, the display panel is partially accommodated in the groove, and a side wall of the display panel is in contact with a side wall of the groove.

Optionally, in some embodiments of the present disclosure, the side wall of the display panel, the side wall of the middle frame, and a bottom of the middle frame form a second module gap, and the filling glue is filled in the second module gap.

Optionally, in some embodiments of the present disclosure, the side wall of the middle frame is provided with injection holes, and the injection holes are interconnected with the first module gap.

Optionally, in some embodiments of the present disclosure, an edge of the coverplate is flush with an outer edge of the middle frame.

Optionally, in some embodiments of the present disclosure, the display panel includes a planar region, a bending region, and a bonding region, the bending region connects the planar region to the bonding region, and the bonding region is bonded to a backlight surface of the planar region by bending the bending region; and the groove includes a bonding part, the bending region and at least a part of the bonding region of the display panel are located in the bonding part, and a width of a connection part between a first side wall of the bonding part and the coverplate is less than 0.5 mm.

Optionally, in some embodiments of the present disclosure, a panel gap is formed between the planar region and the bonding region, the display module further includes a supporting element, and the supporting element is disposed in the panel gap and supports the bending region.

Optionally, in some embodiments of the present disclosure, the supporting element fills the panel gap.

Optionally, in some embodiments of the present disclosure, a material of the supporting element includes epoxy resins, hot-melt adhesives, or thermosetting materials.

Optionally, in some embodiments of the present disclosure, the bonding part includes a first side wall and a first bottom, the first side wall includes a first straight side wall and a first bending side wall, and the first bending side wall connects the first bottom to the first straight side wall; and lengths of the first straight side wall and the first bending side wall are 0.5 mm to 1 mm greater than a length of the bending region of the display panel, wherein, a direction of the lengths of the first straight side wall and the first bending side wall and the length of the bending region of the display panel is parallel to a bending axis of the bending region of the display panel.

Optionally, in some embodiments of the present disclosure, a shape and a size of the first bending side wall are same as a shape and a size of an inner side of a side wall of a first bending part of the bending region, the first bending part is a part between an arc vertex of the bending region and the bonding region, and the arc vertex is tangent to the first side wall of the bonding part.

Optionally, in some embodiments of the present disclosure, in the bending region and the bonding region, the display panel includes a circuit layer and an adhesive layer, and the adhesive layer is disposed on a surface of the circuit layer away from the planar region of the display panel; and the first bottom includes a protruding portion, and the protruding portion protrudes from the side wall of the middle frame and does not exceed the adhesive layer.

Optionally, in some embodiments of the present disclosure, a length of the protruding portion is less than the length of the first bending side wall and is greater than a length of the bending region, and a direction of the length of the protruding portion is parallel to the bending axis of the bending region of the display panel.

Optionally, in some embodiments of the present disclosure, the bonding part includes a first straight side wall and a first bottom, and the first straight side wall is connected to the first bottom.

Optionally, in some embodiments of the present disclosure, the bonding part is disposed on a straight side of the middle frame; or the bonding part is disposed on the straight side of the middle frame and extended to a rounded corner area of the middle frame.

Optionally, in some embodiments of the present disclosure, the groove further includes a side part connected to the bonding part, the side part and the bonding part form an annular groove, a width of the side part is less than a width of the bonding part, and a depth of the side part is less than a depth of the bonding part; and wherein, a direction of the widths of the side part and the bonding part is perpendicular to the side wall of the groove, and a direction of the depths of the side part and the bonding part is perpendicular to a bottom of the groove.

Optionally, in some embodiments of the present disclosure, a material of the middle frame includes epoxy resins or polyethylene composite materials.

Optionally, in some embodiments of the present disclosure, a material of the filling glue includes epoxy resins, hot-melt adhesives, or thermosetting materials.

Meanwhile, the present disclosure provides a display device, which includes a housing and the display module in any one of the embodiments. Wherein, the housing is connected to a bottom surface of the middle frame of the display module, or the housing is connected to the bottom surface and an outer side surface of the middle frame of the display module.

Beneficial effect: the present disclosure provides the display module and the display device. By adding the middle frame and the filling glue in the display module, the middle frame is connected with the sides and backlight surface of the display panel, and the backlight surface of the coverplate, and the filling glue fills the first module gap between the display panel, the coverplate, and the middle frame to connect the middle frame, the display panel, and the coverplate. On the premise of ensuring sufficient adhesion between the middle frame and the display panel, a contact area between the coverplate and the middle frame can be reduced, thereby reducing bezels of the display module. The middle frame has side surfaces and a larger bottom surface area, which provides a sufficient contact area for subsequent assembly between the display module and the housing, thereby further ensuring an assembly effect between the display module and the housing.

DESCRIPTION OF DRAWINGS

The following detailed description of specific embodiments of the present disclosure will make the technical solutions and other beneficial effects of the present disclosure obvious with reference to the accompanying drawings.

DETAILED DESCRIPTION OF PREFERRED EMBODIMENTS

Regarding a problem of bezels in a non-display area having an overly large area in current display devices, the present disclosure provides a display module to solve this problem.

Figure 1:
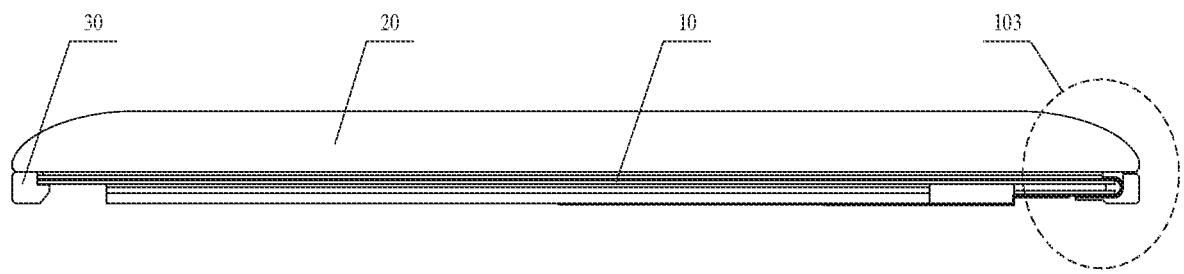
FIG. 1 is a schematic structure diagram of a display module according to an embodiment of the present disclosure.
Figure 2:
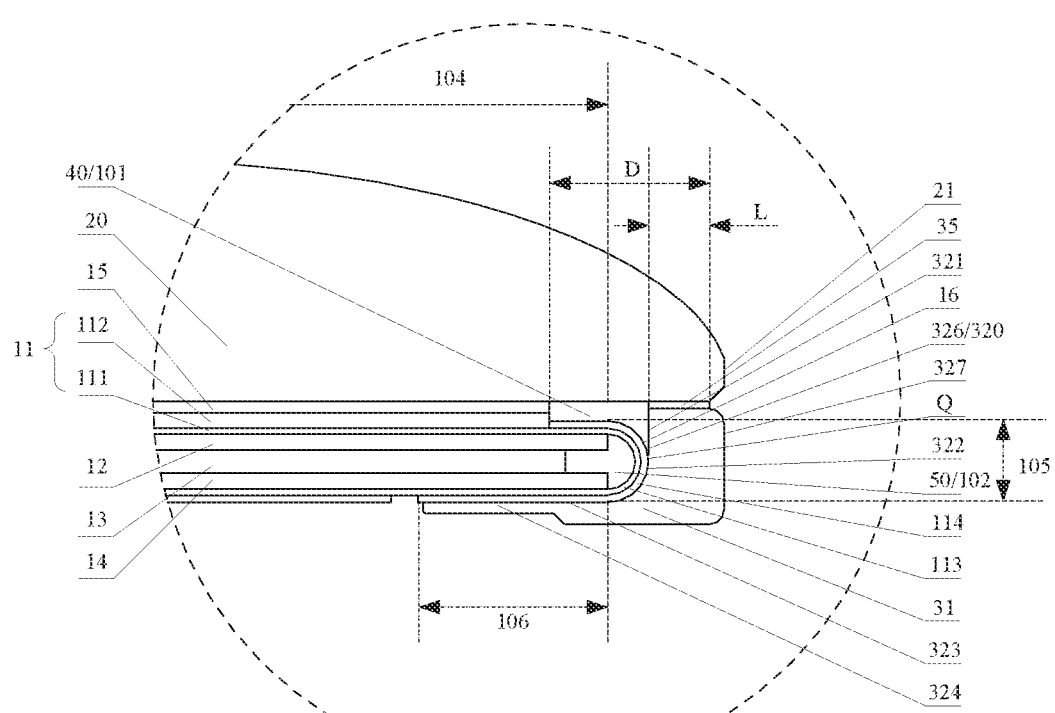
FIG. 2 is a partially enlarged schematic structural diagram of an area 103 in FIG. 1 according to an embodiment of the present disclosure.

In an embodiment, referring to FIGS. 1 and 2, FIG. 1 shows a schematic structure diagram of the display module according to an embodiment of the present disclosure, and FIG. 2 shows a partially enlarged schematic structural diagram of an area 103 in FIG. 1, which specifically shows an enlarged schematic structural diagram of a bonding area of the display module. As shown in FIGS. 1 and 2, the display module provided in an embodiment of the present disclosure includes:

a display panel 10;
a coverplate 20 disposed on a light-emitting surface of the display panel 10;
a middle frame 30 disposed on a same side of the coverplate 20 as the display panel 10, wherein, the middle frame 30 covers sides of the display panel 10 and a portion of a backlight surface of the display panel 10, a side wall 320 of the middle frame 30 is connected to a backlight surface of the coverplate 20, and the middle frame 30, the display panel 10, and the coverplate 20 form a first module gap 101; and
a filling glue 40 filled in the first module gap 101.

The embodiment of the present disclosure provides the display module. By adding the middle frame and the filling glue in the display module, the middle frame is connected with the sides and backlight surface of the display panel, and the backlight surface of the coverplate, and the filling glue fills the first module gap between the display panel, the coverplate, and the middle frame to connect the middle frame, the display panel, and the coverplate. On the premise of ensuring sufficient adhesion between the middle frame and the display panel, a contact area between the coverplate and the middle frame can be reduced, thereby reducing bezels of the display module. The middle frame has side surfaces and a larger bottom surface area, which provides a sufficient contact area for subsequent assembly between the display module and a housing, thereby further ensuring an assembly effect between the display module and the housing.

Specifically, referring to FIG. 2, in an embodiment, the display panel 10 includes a planar region 104, a bending region 105, and a bonding region 106, and the bonding region 106 is bonded to a backlight surface of the planar region 104 by bending the bending region 105. In the planar region 104, the display panel 10 includes a display substrate 11, a first support plate 12, a heat dissipation plate 13, and a second support plate 14 from the light-emitting surface to the backlight surface. The display substrate 11 may be a light-emitting diode (LED) display substrate, a micro-LED (MLED) display substrate, an organic light-emitting diode (OLED) display substrate, or a liquid crystal display (LCD)

display substrate, which is not limited herein. In the planar region 104, the display substrate 11 includes a circuit substrate 111 and a film layer structure 112, the film layer structure 112 is disposed between the circuit substrate 111 and the coverplate 20, and a side of the circuit substrate 111 adjacent to the bending region 105 extends beyond a side of the film layer structure 112 adjacent to the bending region 105. In the bending region 105 and the bonding region 106, the display panel 10 includes a circuit layer 113 and an adhesive layer 114. The adhesive layer 114 is disposed on a surface of the circuit layer 113 away from the heat dissipation plate 13 for protecting the circuit layer 113. A panel gap 102 is formed between the bonding region 106 and the planar region 104. A shape and a size of the panel gap 102 is determined by a size of sides of the first support plate 12, the heat dissipation plate 13, and the second support plate 14 and a curved shape of the bending region 105.

In an embodiment, the coverplate 20 is disposed on the light-emitting side of the display panel 10 and is connected to the light-emitting surface of the display panel 10 by a first optical adhesive layer 15. A planar area of the coverplate 20 is larger than a planar area of the display panel 10, the coverplate 20 covers the display panel 10, and sides of the coverplate 20 extend beyond the sides of the display panel 10.

In an embodiment, the middle frame 30 is disposed on the backlight side of the coverplate 20, and the middle frame includes a groove 31 having a two-sided opening. The groove 31 is defined on one side of the middle frame 30 facing the display panel 10. As an example, the two-sided opening refers to that the middle frame 30 in FIG. 2 has an opening on an upper side and a left side, and a cross-sectional shape of the middle frame 30 is "L"-shaped. The display panel 10 is partially accommodated in the groove 31. That is, the middle frame 30 covers the sides and part of the backlight surface of the display panel 10, which increases a connection area between the middle frame 30 and the display panel 10, thereby improving a connection strength between the middle frame 30 and the display panel 10. At a same time, the middle frame 30 has a larger bottom surface area, which provides a sufficient contact area for subsequent assembly between the display module and the housing, thereby further ensuring the assembly effect between the display module and the housing. Further, the sides of the display panel 10 is in direct contact with the side wall 320 of the middle frame 30. In this way, the problem of increasing the bezels of the display module due to a gap between the sides of the display panel 10 and the middle frame 30 can be prevented. An outer edge 327 of the middle frame 30 is flush with an edge 21 of the coverplate 20, and the side wall 320 of the middle frame 30 is connected to the backlight surface of the coverplate 20 by a second optical adhesive layer 35. A width of the side wall 320 of the middle frame 30 is less than 1 mm, wherein, a direction of the width of the side wall 320 of the middle frame 30 is perpendicular to the side wall 320. A material of the middle frame 30 includes but is not limited to high strength composite materials, such as epoxy resins or polyethylene.

Figure 3:
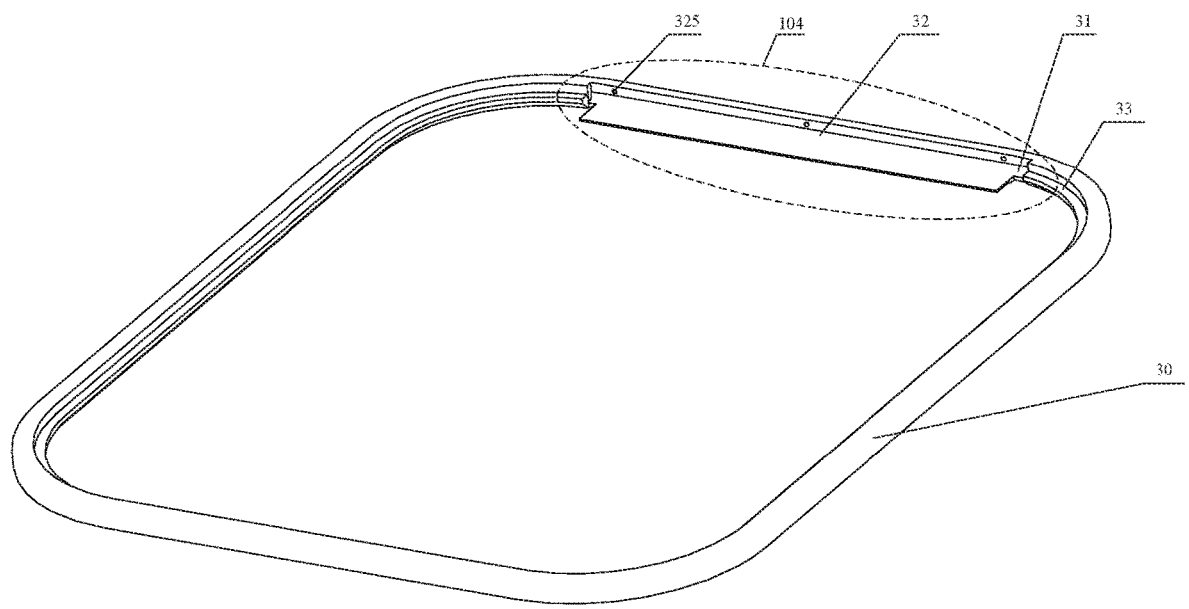
FIG. 3 is a schematic three-dimensional structural diagram of the display module according to an embodiment of the present disclosure.

In an embodiment, referring to FIG. 3, the groove 31 is an annular groove, and the groove 31 includes a bonding part 32 and a side part 33 connected with the bonding part 32. A width of the side part 33 is less than a width of the bonding part 32, and a depth of the side part 33 is less than a depth of the bonding part 32. wherein, a direction of the widths of the side part 33 and the bonding part 32 is perpendicular to the side wall of the groove 31, and a direction of the depths of the side part 33 and the bonding part 32 is perpendicular to a bottom of the groove 31. In other embodiments, the groove 31 may only include the bonding part 32.

In an embodiment, referring to FIG. 2, the bending region 105 and at least a part of the bonding region 106 of the display panel 10 are located in the bonding part 32. The bonding part 32 includes a first side wall 326 and a first bottom 323, and the first side wall 326 includes a first straight side wall 321 and a first bending side wall 322. The first bending side wall 322 connects the first bottom 323 to the first straight side wall 321, the first bottom 323 is connected to the bonding region 106, and the bending region 105 is connected to the first bending side wall 322. A width L of a connection part between the first straight side wall 321 and the coverplate 20 is less than 0.5 mm. In other embodiments, the bonding part 32 may only include the first straight side wall 321 and the first bottom 323, and the first straight side wall 321 is connected to the first bottom 323.

Figure 4:
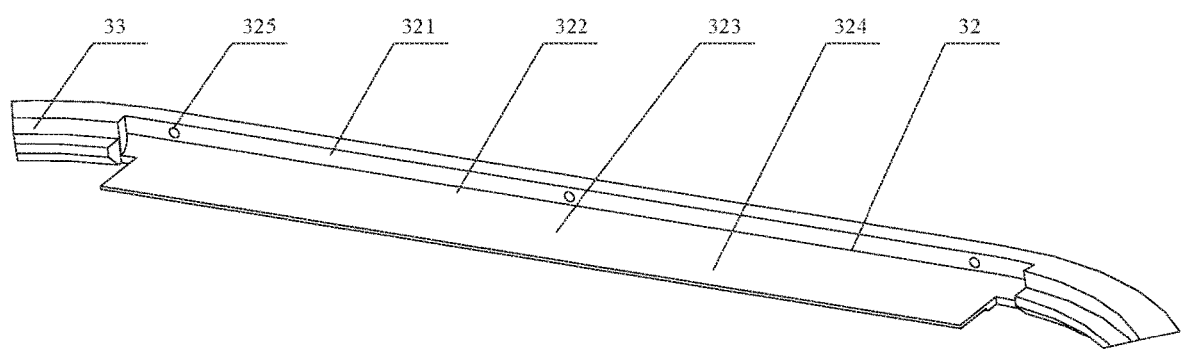
FIG. 4 is a partially enlarged schematic structural diagram of an area 104 in FIG. 3 according to an embodiment of the present disclosure.

Further, a shape and a size of the first bending side wall 322 are same as a shape and a size of an inner side of a side wall of a first bending part of the bending region 105, the first bending part is a part between an arc vertex Q and the bonding region 106. In this way, the bending region 105 can be in contact with the bonding part 32 with a largest area, thereby increasing the connection area between the bonding part 32 and the display panel 10 and improving the connection strength between the middle frame 30 and the display panel 10. Meanwhile, accommodating, supporting, and protecting effects of the bonding part 32 on the display panel 10 can be enhanced. A connection position between the first straight side wall 321 and the first bending side wall 322 is in contact with the arc vertex Q, and the arc vertex Q is tangent to the first side wall 326 of the bonding part 32, which eliminates the gap between the sides of the display panel 10 and the bonding part 32, thereby further reducing the bezels of the display module. A length of the bonding part 32 is 0.5 mm to 1 mm greater than a length of the bending region 105 of the display panel 10, that is, lengths of the first straight side wall 321 and the first bending side wall 322 are 0.5 mm to 1 mm greater than the length of the bending region 105 of the display panel 10, thereby ensuring the bending region 105 to be safely accommodated in the bonding part 32. Wherein, a direction of the length of the bonding part 32 and the length of the bending region 105 of the display panel 10 is parallel to a bending axis of the bending region 105 of the display panel 10. As shown in FIG. 3, the middle frame 30 includes four straight sides and four rounded corner areas, and the straight sides and the rounded corner areas form a ring-shaped middle frame. The bonding part 32 may only be disposed on a straight side of the middle frame 30 or may be extended to a rounded corner area of the middle frame 30 as shown in FIG. 4. Specifically, it may be set according to the length and size of the bending region 105 and the bonding region 106 of the display panel 10.

The first bottom 323 includes a protruding portion 324, and the protruding portion 324 protrudes from the side wall 320 of the middle frame 30 and does not exceed the adhesive layer 114. A length of the protruding portion 324 is less than the length of the first bending side wall 322 and is greater than a length of the bonding region 106, and a direction of the length of the protruding portion 324 is parallel to the bending axis of the bending region 105 of the display panel 10. The protruding portion 324 is connected to the bonding region 106 for supporting the display panel 10 and protecting the bonding region 106, and at a same time, the protruding portion 324 does not affect the bonding effect between the bonding region 106 and the display panel 10. A top surface of the first straight side wall 321 is not higher than the light-emitting surface of the display panel 10.

Similarly, the side part 33 may include a second side wall (not shown in the figures) and a second bottom (not shown in the figures), and the second side wall includes a second straight side wall (not shown in the figures) and a second bending side wall (not shown in the figures). The side part 33 may only include the second straight side wall and the second bottom, or the second bending side wall and the second bottom. Similarly, the sides of the display panel 10 is in contact with and tangent to the second side wall of a corresponding side part 33. In this way, the gap between the display panel 10 and the side part 33 can be reduced, and the bezels of the display module can be reduced.

Since the side of the circuit substrate 111 adjacent to the bending region 105 extends beyond the side of the film layer structure 112 adjacent to the bending region 105 and the bending region 105 is bent to the backlight surface of the display panel 10, the first module gap 101 is formed between the display panel 10, the coverplate 20, and the middle frame 30. In an embodiment, the side wall 16 of the display panel 10 is in contact with the side wall 320 of the middle frame 30, and the first module gap 101 is a gap surrounded by the side wall 16 of the display panel 10, the side wall 320 of the middle frame 30, and the coverplate 20. In another embodiment, the side wall 16 of the display panel 10 is not in contact with the side wall 320 of the middle frame 30, and the first module gap 101 is a gap surrounded by the side wall 16 of the display panel 10, the coverplate 20, and the first side wall 326 and the first bottom 323 of the bonding part 32. Similarly, the first module gap 101 may also be formed between the side part 33, the display panel 10, and the coverplate 20.

The filling glue 40 is filled in the first module gap 101 to connect the display panel 10, the coverplate 20, and the middle frame 30, thereby further increasing the connection area between the middle frame 30, the display panel 10, and the coverplate 20, and improving the adhesion and connection strength between the middle frame 30, the display panel 10, and the coverplate 20. At a same time, the tensile performance of the coverplate can be also improved. In order to ensure the connection effect between the middle frame 30, the coverplate 20, and the display panel 10, a sum D of a width of a connection part between the coverplate 20 and the middle frame 30 and a width of a connection part between the coverplate 20 and the filling glue 40 is greater than 1 mm. Correspondingly, the first side wall 326 of the bonding part 32 is provided with injection holes 325, and the injection holes 325 are interconnected with the first module gap 101 for injecting the filling glue 40 into the first module gap 101. The injection holes 325 are uniformly arranged on the first side wall 326 of the bonding part 32, thereby ensuring the uniformity of the filling glue 40 in the first module gap 101. A material of the filling glue 40 includes, but is not limited to, materials that are cured below 100° C. or have a low curing shrinkage, such as epoxy resins, hot-melt adhesives, or thermosetting adhesives.

Further, when the side wall 16 of the display panel 10 is in contact with the side wall 320 of the middle frame 30, and the side wall 16 of the display panel 10, the side wall 320 of the middle frame 30, and a bottom of the middle frame 30 form a second module gap (not shown in the figures), the filling glue 40 is further filled in the second module gap. Similarly, the side wall 320 of the middle frame 30 is provided with injection holes corresponding to the second module gap. In this way, the filling glue 40 further increases the connection area between the middle frame 30 and the display panel 10, and improves the adhesion and the connection strength between the middle frame 30 and the display panel 10.

The display module further includes a supporting element 50. The supporting element 50 is disposed between the planar region 104 and the bending region 105, and fills the panel gap 102 between the planar region 104 and the bending region 105, thereby supporting the bending region 105, and preventing deformation of the bending region 105 or disconnection of the circuit layer 113 during injecting the filling glue 40. The shape and size of the supporting element 50 are adapted to the shape and size of the bending region 105 or the panel gap 102, as long as it can play a role of supporting the bending region 105, which is the content protected by the present disclosure, and there is no specific limitation thereof. A material of the supporting element 50 includes, but is not limited to, materials that are cured below 100° C. or have a low curing shrinkage, such as epoxy resins, hot-melt adhesives, or thermosetting adhesives.

Correspondingly, an embodiment of the present disclosure further provides a manufacturing method of a display module for manufacturing the display module provided in the embodiments of the present disclosure.

Figure 5:
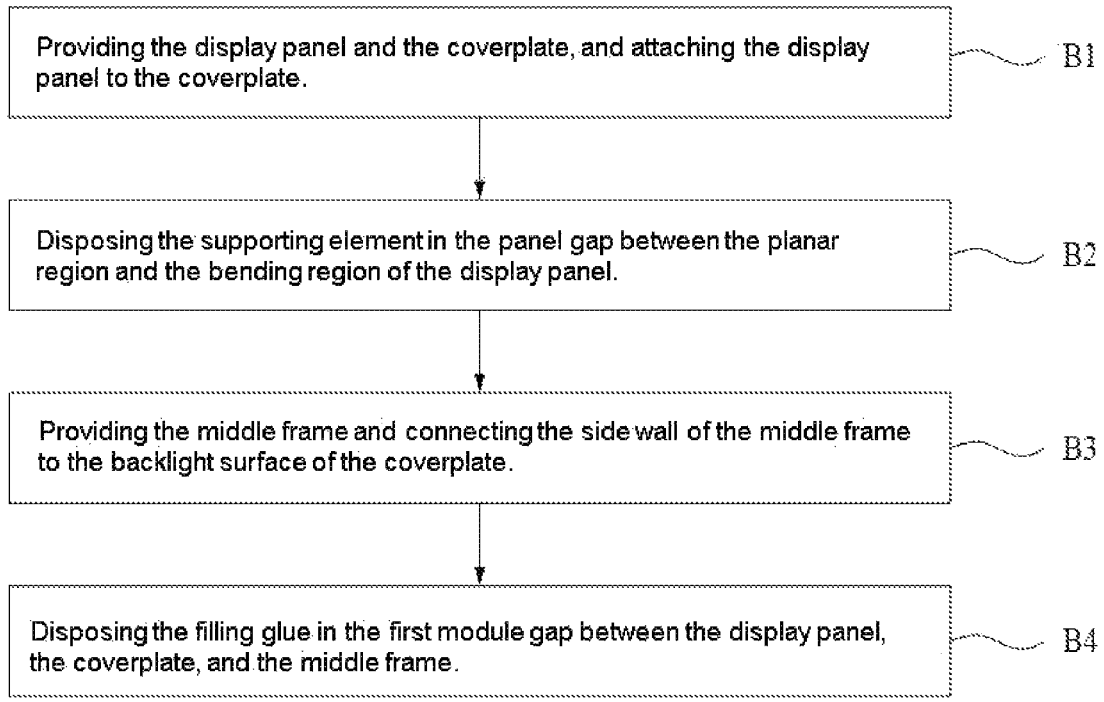
FIG. 5 is a first flowchart of a manufacturing method of the display module according to an embodiment of the present disclosure.

In an embodiment, referring to FIG. 5, the manufacturing method includes following steps.

Step B1: providing the display panel and the coverplate, and attaching the display panel to the coverplate. Specifically, the light-emitting surface of the display panel is attached to the backlight surface of the coverplate by the first optical adhesive layer.

Step B2: disposing the supporting element in the panel gap between the planar region and the bending region of the display panel. Specifically, the supporting element is manufactured in the panel gap between the planar region and the bending region of the display panel after the bonding process by preparation methods such as injection molding. The supporting element fills the panel gap.

Step B3: providing the middle frame and connecting the side wall of the middle frame to the backlight surface of the coverplate. Specifically, the middle frame in the embodiments of the present disclosure is manufactured, the display panel is disposed in the groove of the middle frame, and the side wall of the middle frame is attached to the backlight surface of the coverplate by the second optical adhesive layer.

Step B4: disposing the filling glue in the first module gap between the display panel, the coverplate, and the middle frame. Specifically, the filling glue is injected into the first module gap through the injection holes on the side wall of the middle frame by glue injection processes. Further, the step B4 further includes disposing the filling glue in the second module gap between the display panel and the middle frame.

Figure 6:
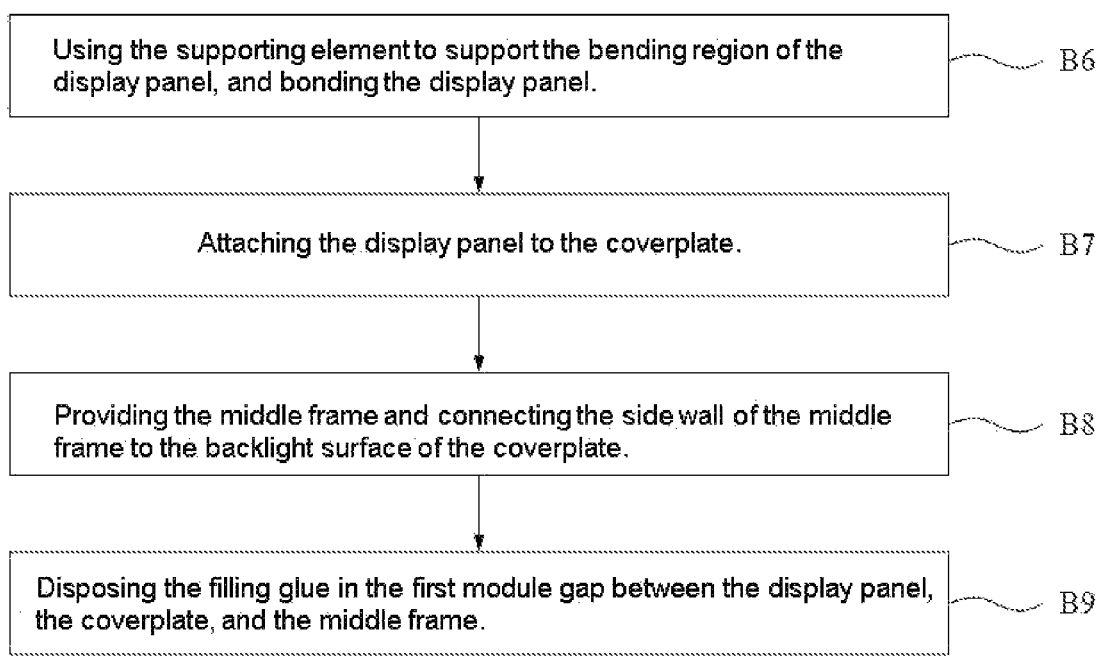
FIG. 6 is a second flowchart of the manufacturing method of the display module according to an embodiment of the present disclosure.

In another embodiment, referring to FIG. 6, the manufacturing method includes following steps.

Step B6: using the supporting element to support the bending region of the display panel, and bonding the display panel. Specifically, the supporting element is disposed on sides of the heat dissipation plate of the display panel, the bending region of the display panel is bent, and the bonding region of the display panel is bonded to the backlight surface of the display panel, and the supporting element supports the bending region.

Step B7: attaching the display panel to the coverplate. Specifically, the light-emitting surface of the display panel is attached to the backlight surface of the coverplate by the first optical adhesive layer.

Step B8: providing the middle frame and connecting the side wall of the middle frame to the backlight surface of the coverplate. Specifically, the middle frame in the embodiments of the present disclosure is manufactured, the display panel is disposed in the groove of the middle frame, and the side wall of the middle frame is attached to the backlight surface of the coverplate by the second optical adhesive layer.

Step B9: disposing the filling glue in the first module gap between the display panel, the coverplate, and the middle frame. Specifically, the filling glue is injected into the first module gap through the injection holes on the side wall of the middle frame by glue injection processes. Further, the step B9 further includes disposing the filling glue in the second module gap between the display panel and the middle frame.

An embodiment of the present disclosure further provides a display device, which includes a housing and the display module in any one of the embodiments. Wherein, the housing is connected to a bottom surface of the middle frame of the display module, or the housing is connected to the bottom surface and an outer side surface of the middle frame of the display module. Since the display device includes the display module in any one of the embodiments provided in the present disclosure, the display device has technical features and beneficial effects in any one of the embodiments provided in the present disclosure. For specific implementation and working principles, please refer to the embodiments mentioned above, and they will not be repeated here.

In summary, the embodiments of the present disclosure provide the display module and the display device. By adding the middle frame and the filling glue in the display module, the middle frame is connected with the sides and backlight surface of the display panel, and the backlight surface of the coverplate, and the filling glue fills the first module gap between the display panel, the coverplate, and the middle frame to connect the middle frame, the display panel, and the coverplate. On the premise of ensuring sufficient adhesion between the middle frame and the display panel, the contact area between the coverplate and the middle frame can be reduced, thereby reducing the bezels of the display module. The middle frame has the side surfaces and the larger bottom surface area, which provides a sufficient contact area for subsequent assembly between the display module and the housing, thereby further ensuring the assembly effect between the display module and the housing.

The display module and the display device provided by the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A display module, comprising:
    a display panel;
    a coverplate disposed on a light-emitting surface of the display panel;
    a middle frame disposed on a same side of the coverplate as the display panel, wherein the middle frame covers sides of the display panel and a portion of a backlight surface of the display panel, a side wall of the middle frame is connected to a backlight surface of the coverplate, and the middle frame, the display panel, and the coverplate form a first module gap; and
    a filling glue filled in the first module gap;
    wherein the display panel comprises a planar region, a bending region, and a bonding region, the bending region connects the planar region to the bonding region, and the bonding region is bonded to a backlight surface of the planar region by bending the bending region;
    wherein the middle frame comprises a groove having a two-sided opening, the groove is defined on one side of the middle frame facing the display panel, and the groove comprises a bonding part; and
    wherein the bonding part comprises a first side wall and a first bottom, the first side wall comprises a first straight side wall and a first bending side wall, and the first bending side wall connects the first bottom to the first straight side wall; and lengths of the first straight side wall and the first bending side wall are 0.5 mm to 1 mm greater than a length of the bending region of the display panel, wherein a direction of the lengths of the first straight side wall and the first bending side wall and the length of the bending region of the display panel is parallel to a bending axis of the bending region of the display panel.

2. The display module according to claim 1, wherein the coverplate has a first region connected with the filing glue, and a second region connected with the middle frame; wherein a sum of a width of the first region and a width of the second region is greater than 1 mm, and the width of the second region is less than 1 mm.

3. The display module according to claim 1, wherein the display panel is partially accommodated in the groove, and a side wall of the display panel is in contact with a side wall of the groove.

4. The display module according to claim 3, wherein the side wall of the display panel, the side wall of the middle frame, and a bottom of the middle frame form a second module gap, and the filling glue is filled in the second module gap.

5. The display module according to claim 3, wherein the bending region and at least a part of the bonding region of the display panel are located in the bonding part, and a width of a connection part between a first side wall of the bonding part and the coverplate is less than 0.5 mm.

6. The display module according to claim 5, wherein a panel gap is formed between the planar region and the bonding region, the display module further comprises a supporting element, and the supporting element is disposed in the panel gap and supports the bending region.

7. The display module according to claim 6, wherein the supporting element fills the panel gap.

8. The display module according to claim 6, wherein a material of the supporting element comprises epoxy resins, hot-melt adhesives, or thermosetting materials.

9. The display module according to claim 5, wherein the bonding part is disposed on a straight side of the middle frame; or
    the bonding part is disposed on the straight side of the middle frame and extended to a rounded corner area of the middle frame.

10. The display module according to claim 1, wherein the side wall of the middle frame is provided with injection holes, and the injection holes are interconnected with the first module gap.

11. The display module according to claim 1, wherein an edge of the coverplate is flush with an outer edge of the middle frame.

12. The display module according to claim 1, wherein a shape and a size of the first bending side wall are same as a shape and a size of an inner side of a side wall of a first bending part of the bending region, the first bending part is a part between an arc vertex of the bending region and the bonding region, and the arc vertex is tangent to the first side wall of the bonding part.

13. The display module according to claim 1, wherein in the bending region and the bonding region, the display panel comprises a circuit layer and an adhesive layer, and the adhesive layer is disposed on a surface of the circuit layer away from the planar region of the display panel; and the first bottom comprises a protruding portion, and the protruding portion protrudes from the side wall of the middle frame and does not exceed the adhesive layer.

14. The display module according to claim 13, wherein a length of the protruding portion is less than the length of the first bending side wall and is greater than a length of the bonding region, and a direction of the length of the protruding portion is parallel to the bending axis of the bending region of the display panel.

15. The display module according to claim 1, wherein the groove further comprises a side part connected to the bonding part, the side part and the bonding part form an annular groove, a width of the side part is less than a width of the bonding part, and a depth of the side part is less than a depth of the bonding part; and wherein a direction of the widths of the side part and the bonding part is perpendicular to the side wall of the groove, and a direction of the depths of the side part and the bonding part is perpendicular to a bottom of the groove.

16. The display module according to claim 1, wherein a material of the middle frame comprises epoxy resins or polyethylene composite materials.

17. The display module according to claim 1, wherein a material of the filling glue comprises epoxy resins, hot-melt adhesives, or thermosetting materials.

18. A display device, comprising a housing and the display module according to claim 1, wherein the housing is connected to a bottom surface of the middle frame of the display module, or the housing is connected to the bottom surface and an outer side surface of the middle frame of the display module.

* * * * *